(12) United States Patent
Tsironis

(10) Patent No.: US 8,786,293 B1
(45) Date of Patent: Jul. 22, 2014

(54) NOISE PARAMETER MEASUREMENT SYSTEM AND METHOD

(76) Inventor: Christos Tsironis, Kirkland (CA)

( * ) Notice: Subject to any disclaimer, the term of this patent is extended or adjusted under 35 U.S.C. 154(b) by 362 days.

(21) Appl. No.: 13/198,966

(22) Filed: Aug. 5, 2011

(51) Int. Cl.
*G01R 27/06* (2006.01)

(52) U.S. Cl.
USPC ............................ 324/613; 324/650

(58) Field of Classification Search
USPC ................. 324/650, 613, 637–645
See application file for complete search history.

(56) References Cited

U.S. PATENT DOCUMENTS

| | | | | |
|---|---|---|---|---|
| 5,191,294 A | * | 3/1993 | Grace et al. | 324/613 |
| 5,621,331 A | * | 4/1997 | Smith et al. | 324/645 |
| 2010/0030504 A1 | | 2/2010 | Simpson | |

FOREIGN PATENT DOCUMENTS

DE  41 22 189  1/1993

OTHER PUBLICATIONS

H. Rothe and W.Dahlke, "Theory of noisy fourpoles", Proceedings of the IRE, Jun. 1956, pp. 811-818.
"Friis formulas for noise", http://en.wikipedia.org/wiki/Friis_formulas_for_noise, 1966.
Sischka, Franz, "Basics of S-parameters, part 1", Characterization handbook, Mar. 2002.
"Understanding Noise Parameter Basics/Understanding Noise Parameter Measurements", Application Note AN60-040, http://www.modelithics.com/literature.asp, Feb. 2006.
M. Sannino, "On the determination of Device Noise and Gain Parameters", Proceedings IEEE, vol. 67, pp. 1364-1382, Sep. 1979.
R. Lane, "The determination of Device Noise Parameters", Proceedings IEEE, vol .57, pp. 1461-1462, Aug. 1969.
"Noise Figure Measurement Accuracy—The Y-Factor Method", Agilent Application Note 57-2, http://cp.literature.agilent.com/litweb/pdf/5952-3706E.pdf, Mar. 2004.
"About Adapter Removal Calibration Technique", Agilent, http://ena.tm.agilent.com/e5071c/manuals/webhelp/eng/measurement/calibration/advanced_calibrations/adapter_removal.htm#About_Adapter_Removal.
"Stability Circles: Input/Output Plane Stability Circles (SB1, SB2)", Agilent, http://cp.literature.agilent.com/litweb/pdf/genesys200801.
"Singular Value Decomposition", Wikipedia, http://en.wikipedia.org/wiki/Singular_value_decomposition.

* cited by examiner

*Primary Examiner* — Vincent Q Nguyen

(57) ABSTRACT

A wideband four noise parameter measurement system and method uses electro-mechanical wideband tuners and fast noise and small signal receivers (network analyzers) to collect noise data in fast frequency sweeps over a large number of randomly distributed source tuner states; because of the random nature of source impedances, additional monitoring equipment allow evaluating critical device parameters in view of output mismatch and instabilities in order to validate the measured data. Multiple noise parameter extractions for all possible cross-combinations of source impedance states at each measured frequency allows reliable and physically meaningful generation of wideband noise parameters, even for very low noise and potentially unstable DUT's.

16 Claims, 16 Drawing Sheets

Noise parameter measurement system using stand-alone noise receiver.
Solid path: Noise measurement, dotted path: s-parameter measurement

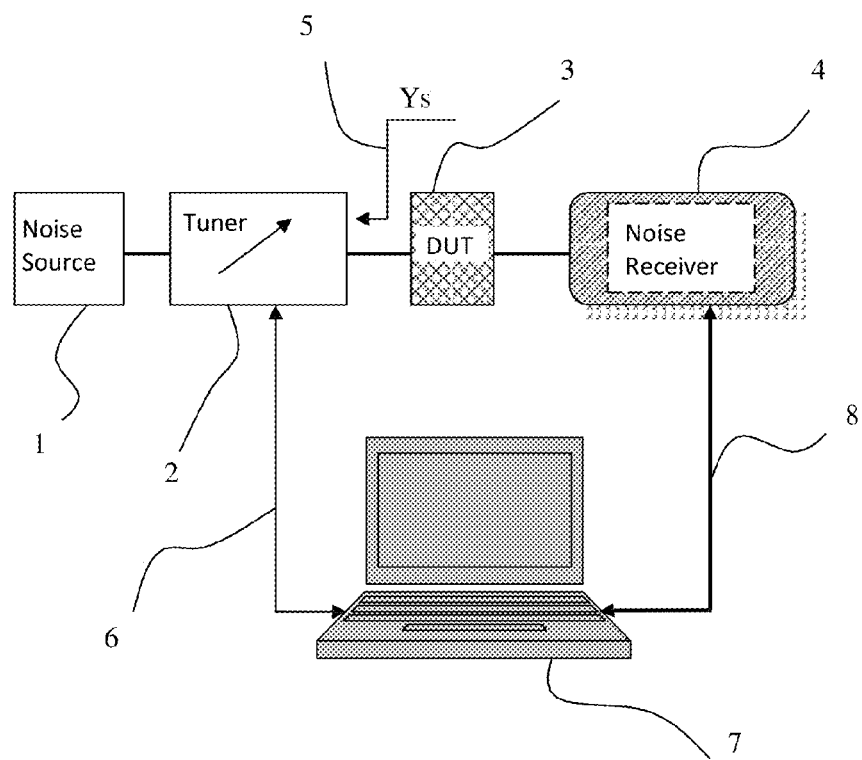
FIGURE 1: prior art: Principle of noise parameter measurement system

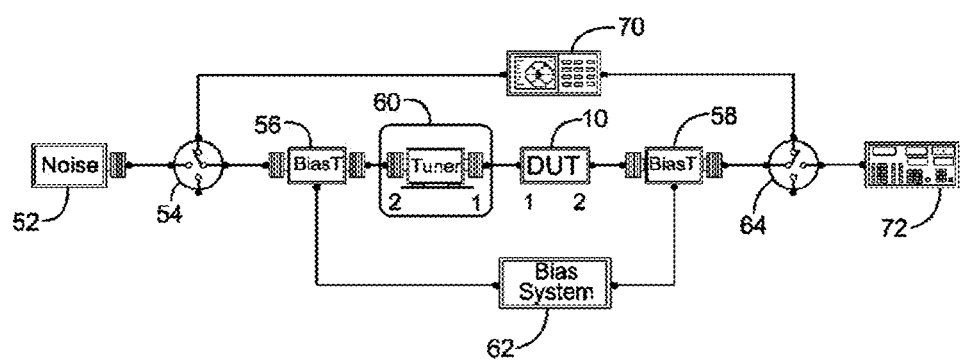
FIGURE 2: prior art, traditional noise parameter measurement setup.

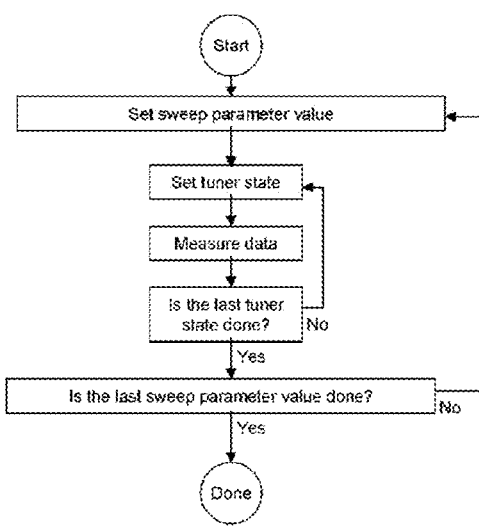
FIGURE 3: prior art, noise parameter measurement procedure uses tuning loop inside parameter loop.

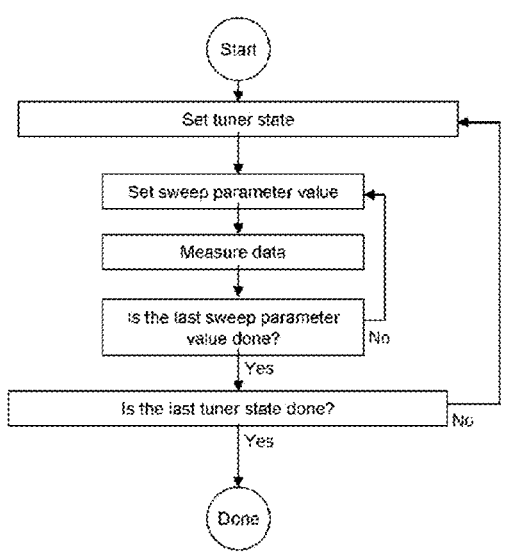
FIGURE 4: prior art, noise parameter measurement procedure uses parameter loop inside tuning loop.

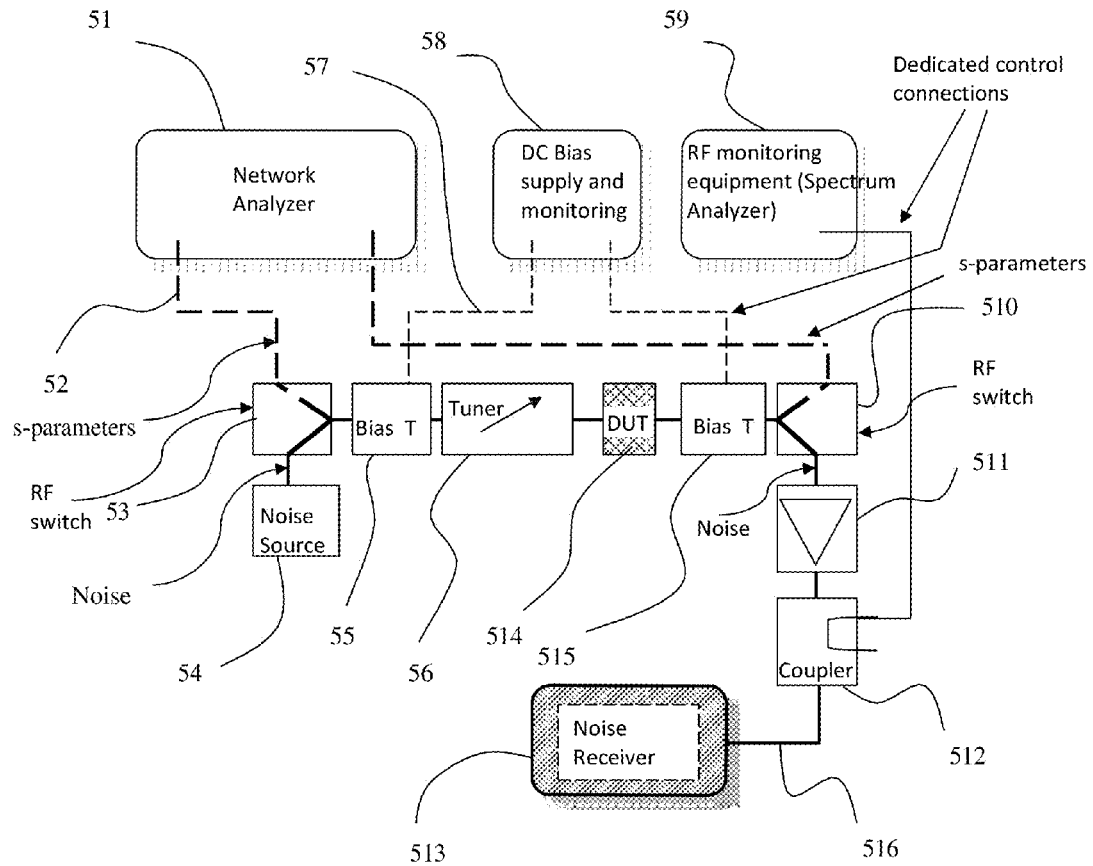
FIGURE 5: Noise parameter measurement system using stand-alone noise receiver:
Solid path: Noise measurement, dotted path: s-parameter measurement

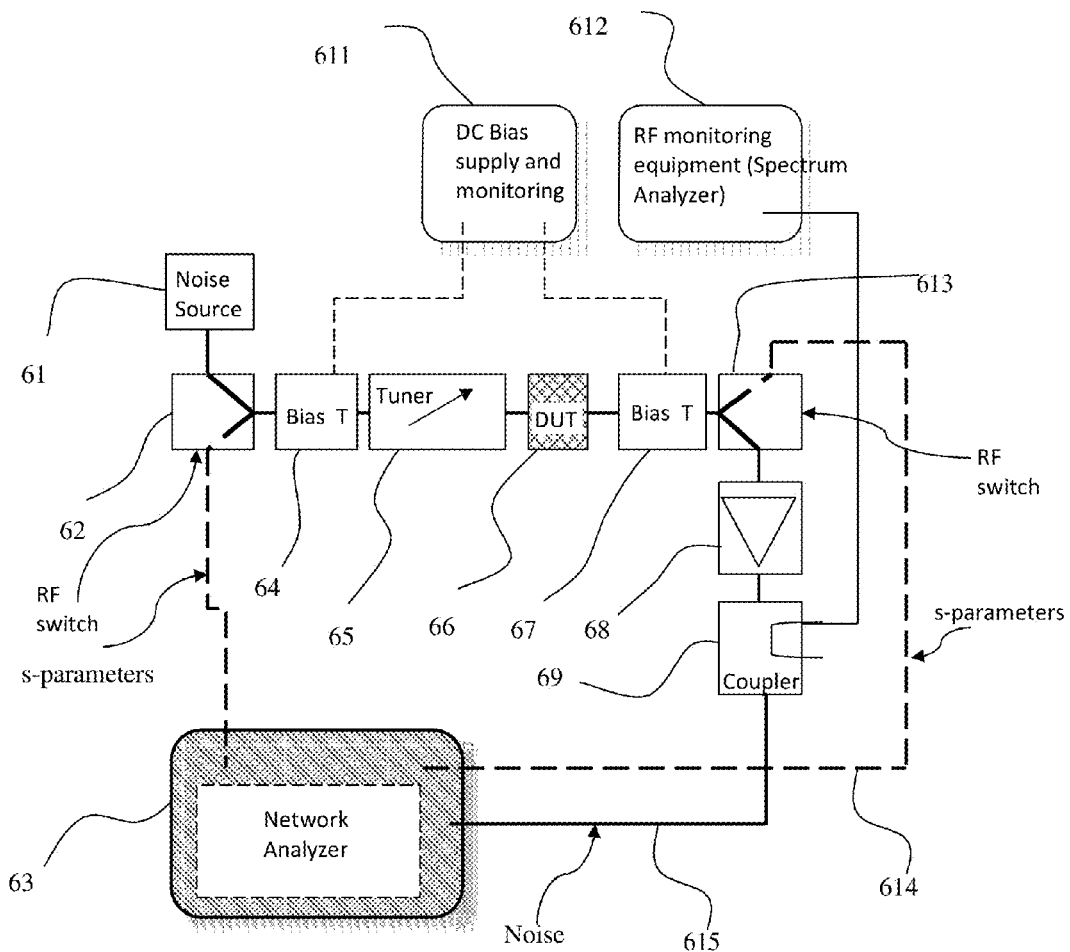
FIGURE 6: Noise parameter measurement system using network analyzer as noise receiver:
Solid path: Noise measurement, dotted path: s-parameter measurement

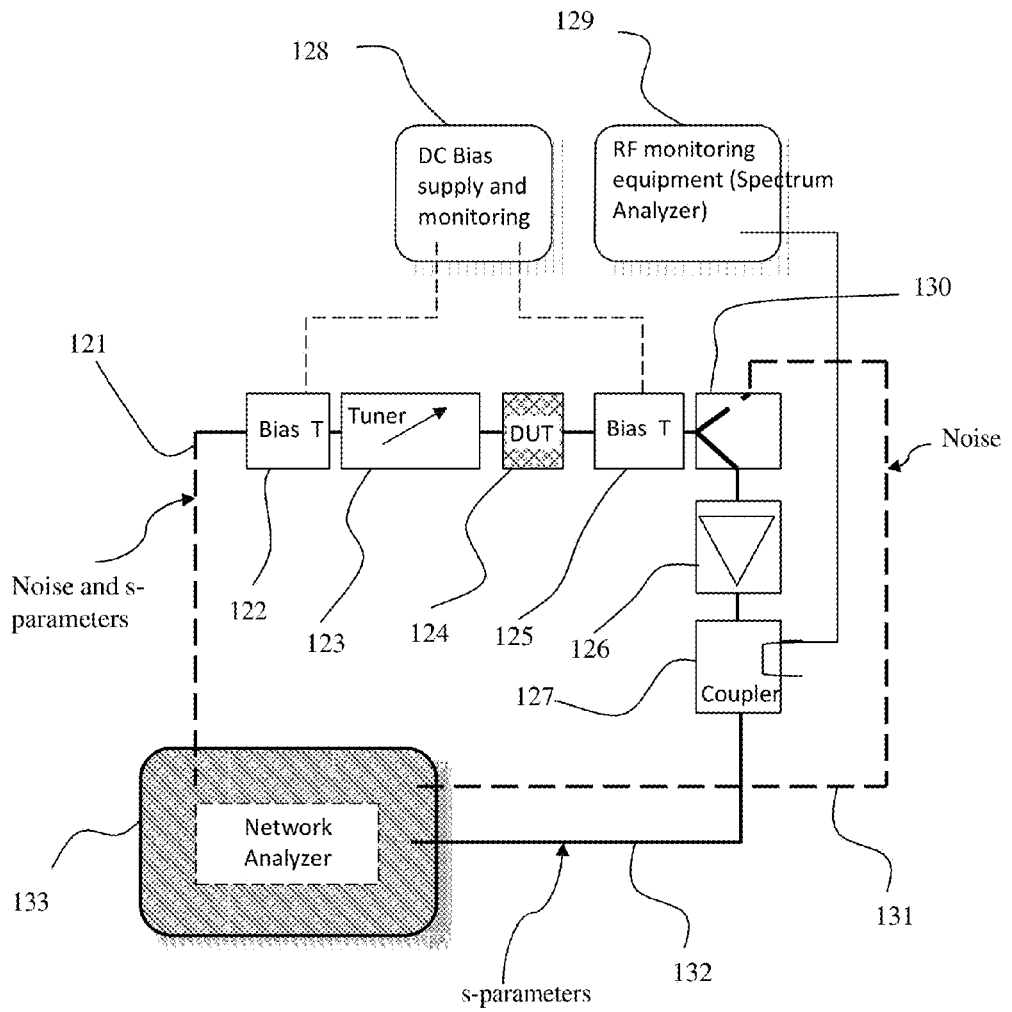
FIGURE 7: Noise parameter measurement system using network analyzer as noise receiver and a small signal instead of a noise source

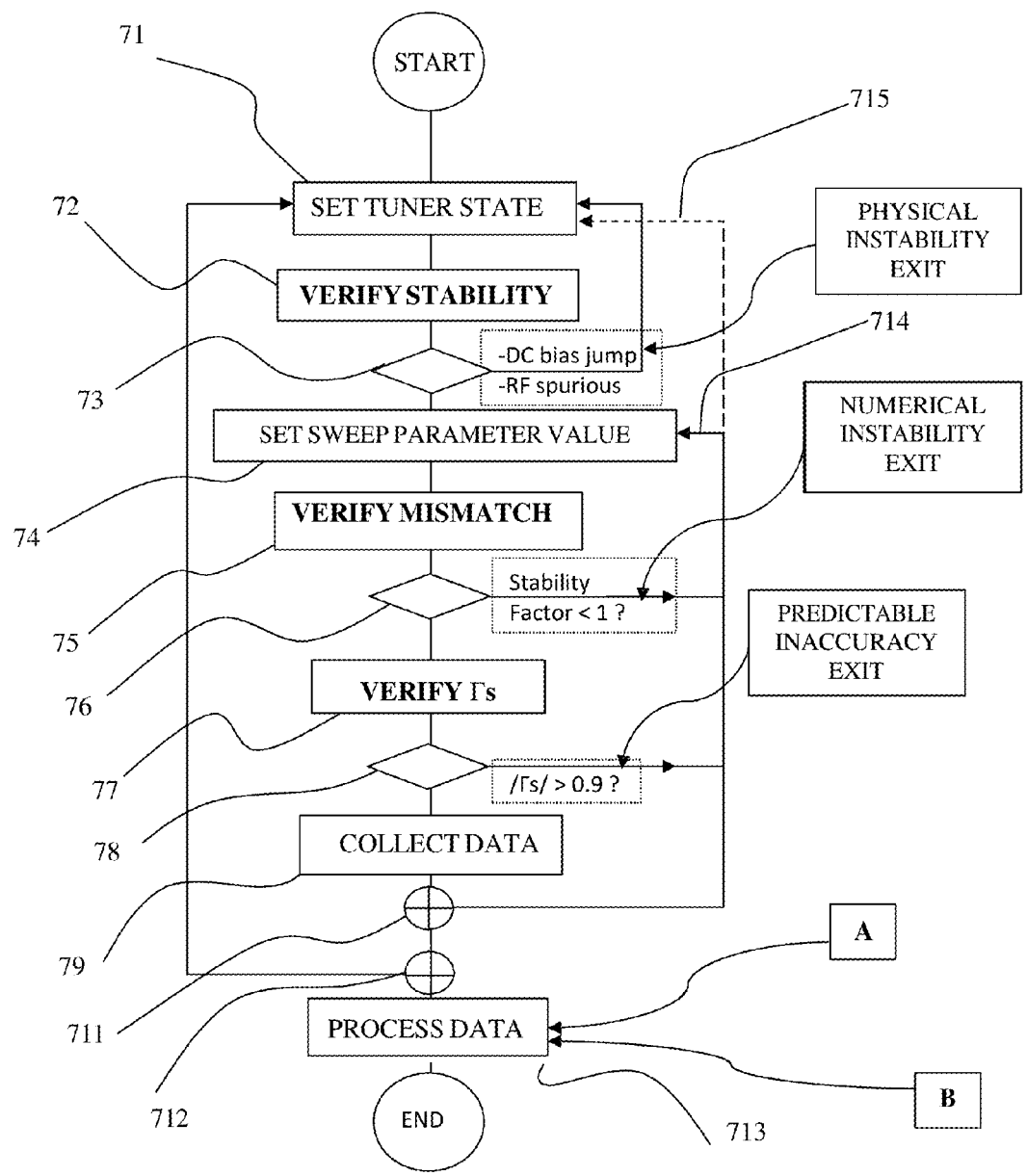
FIGURE 8: Noise parameter measurement algorithm using parameter and data filtering.

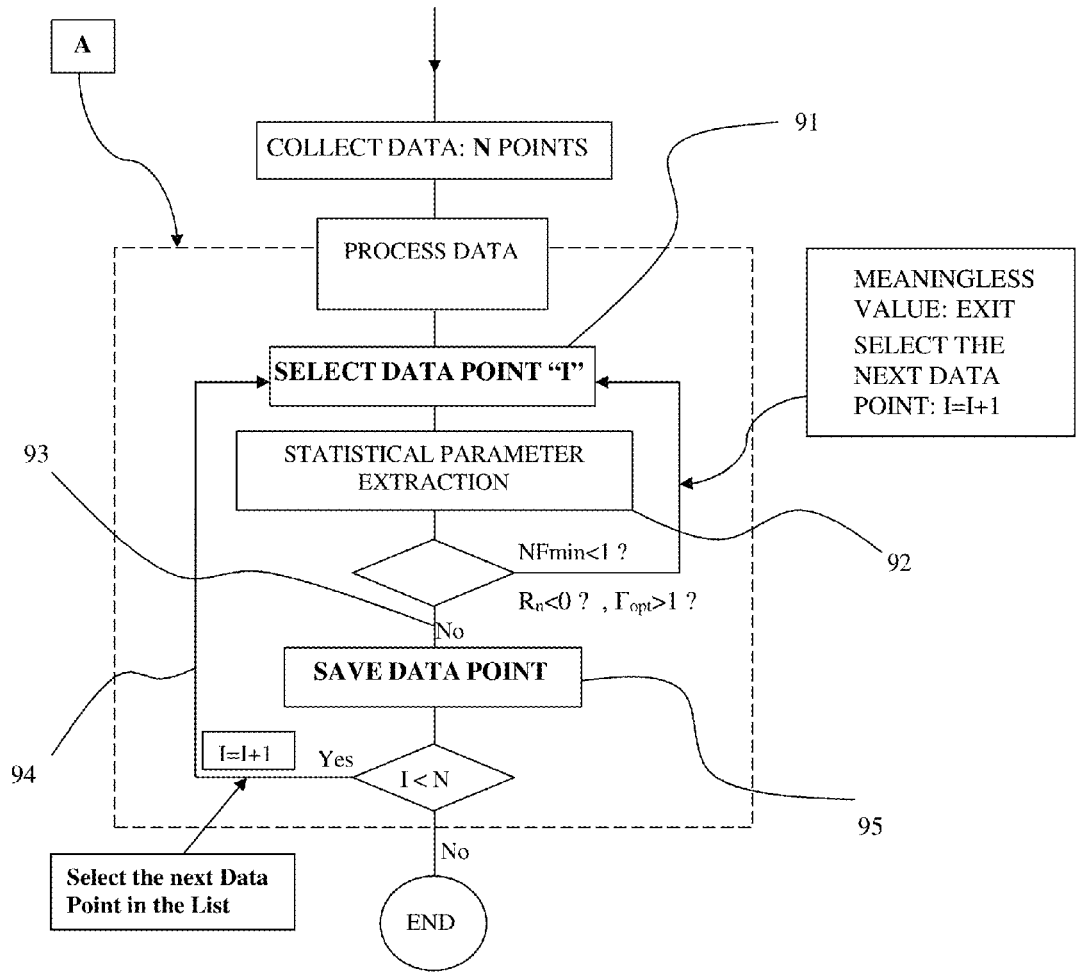
FIGURE 9: Operation detail "A" of measurement algorithm

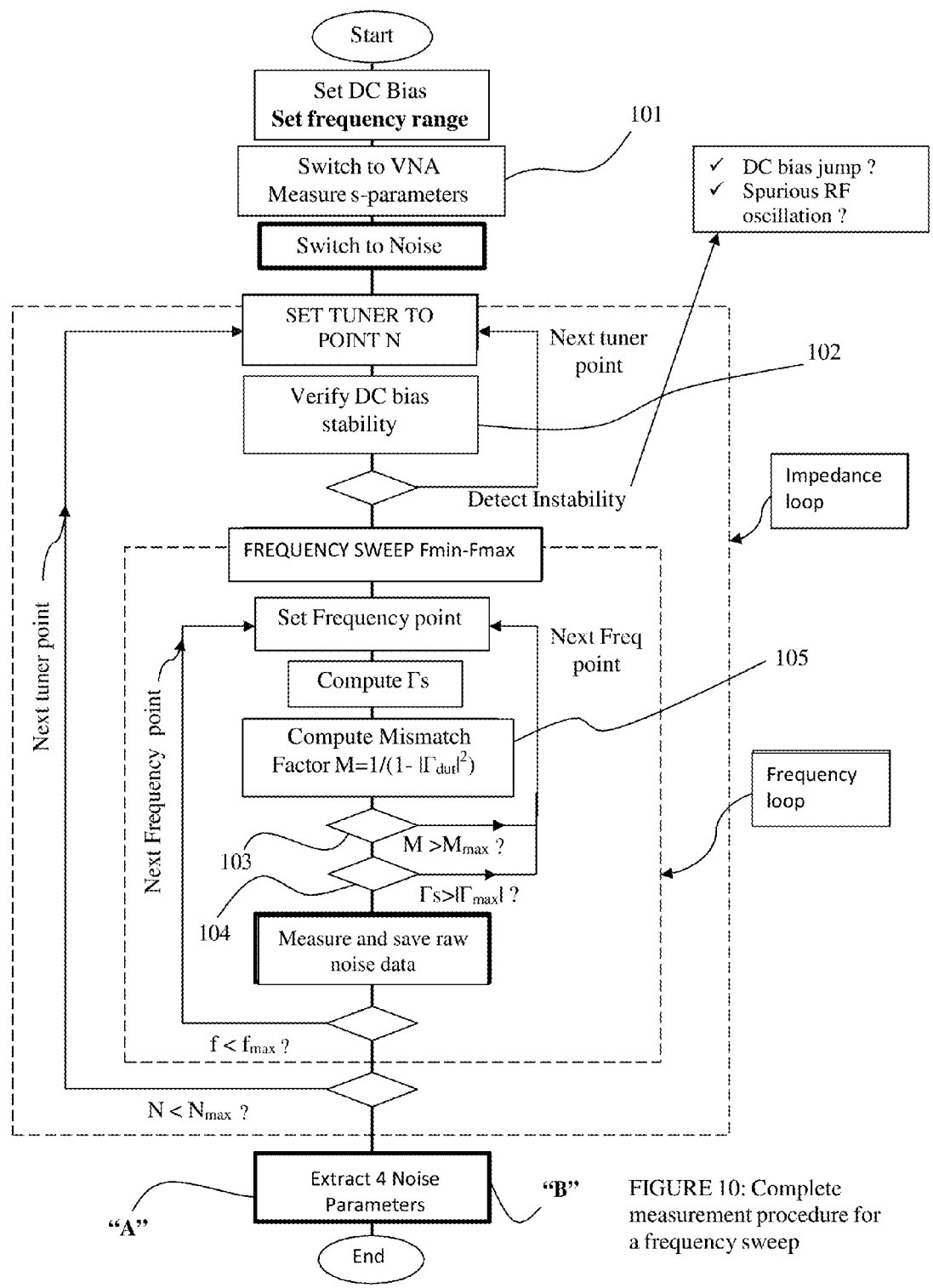
FIGURE 10: Complete measurement procedure for a frequency sweep

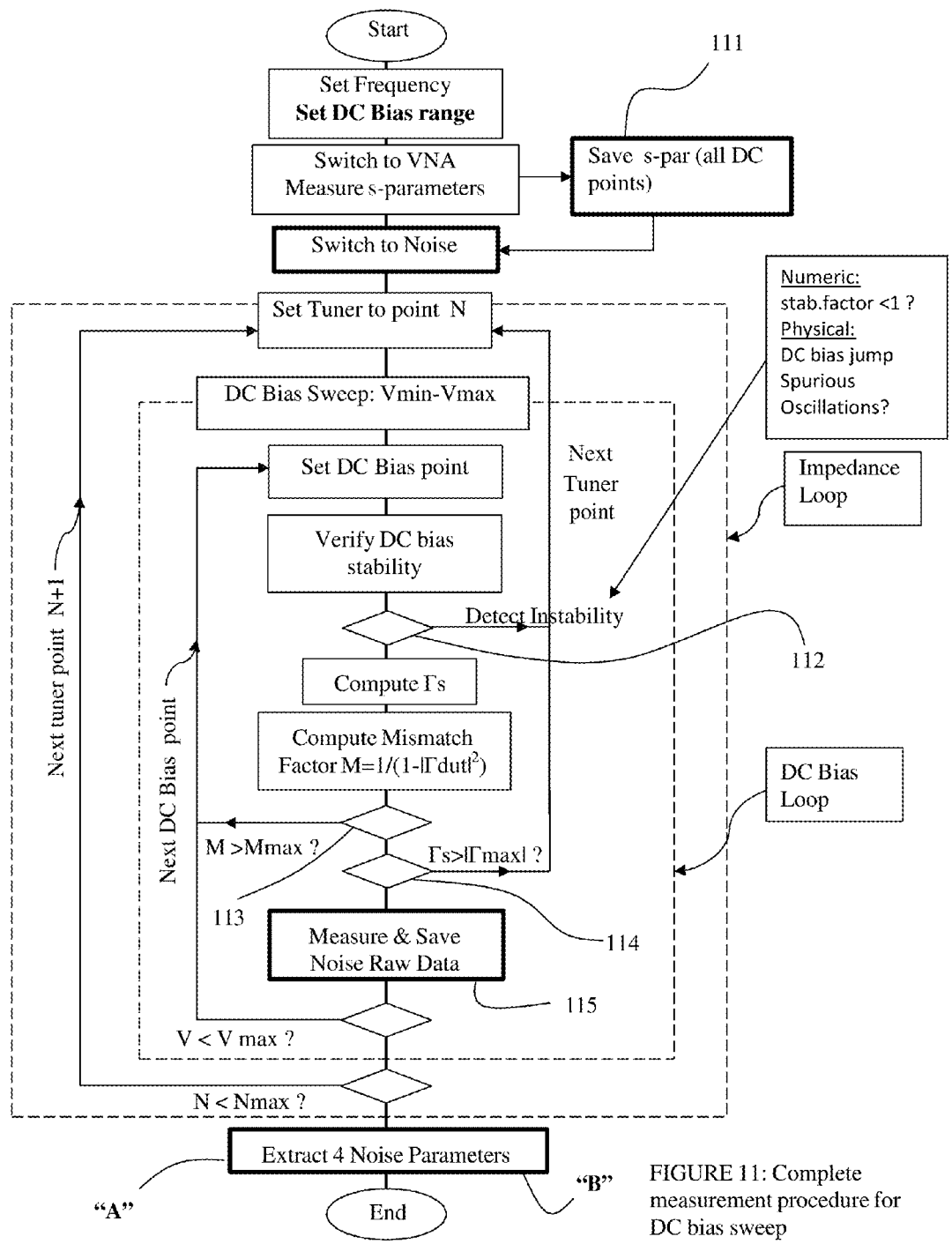
FIGURE 11: Complete measurement procedure for DC bias sweep

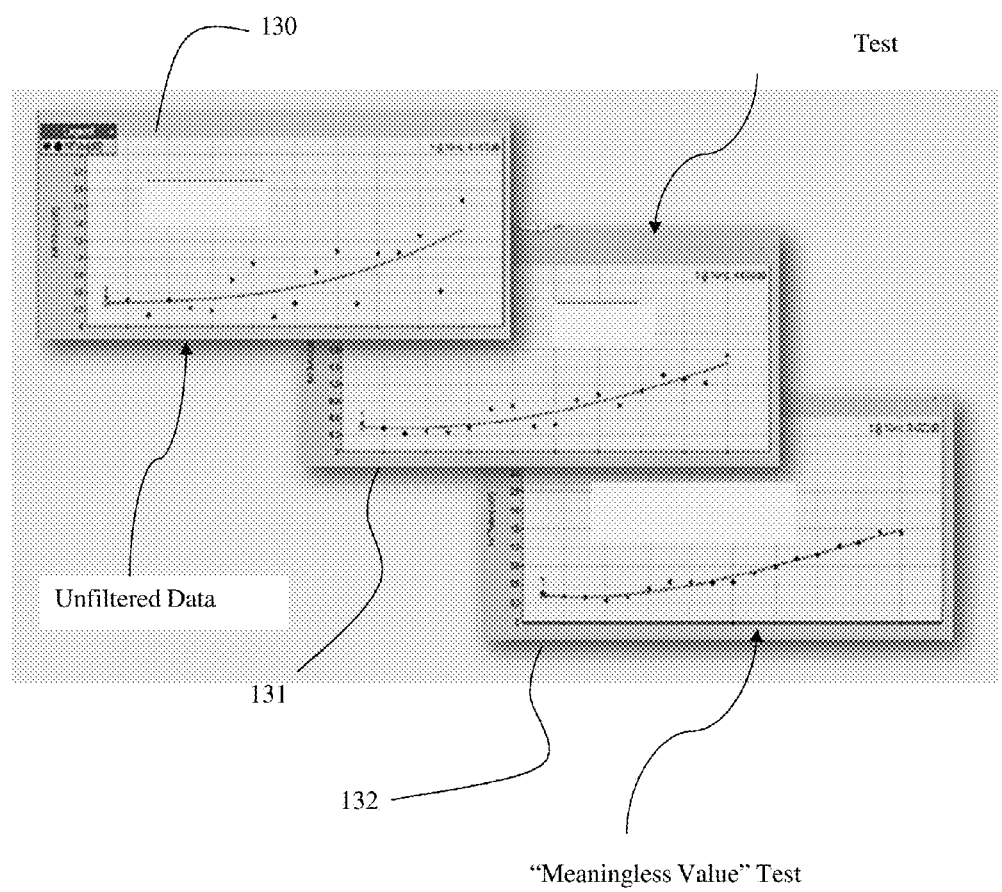
FIGURE 12: Effect of data filtering on extracted minimum noise figure NFmin.

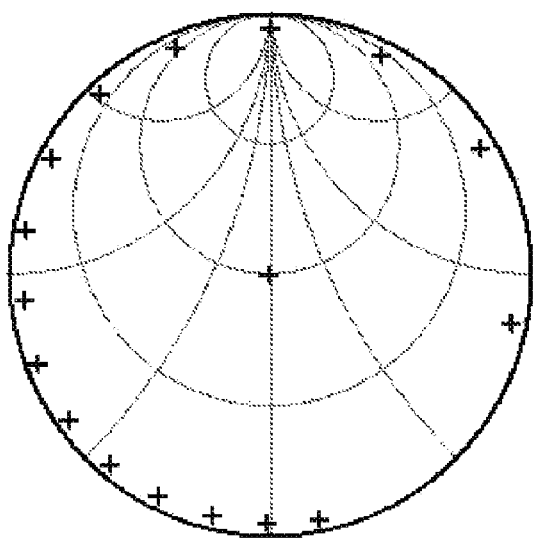
FIGURE 13: prior art [5], source reflection factor distribution

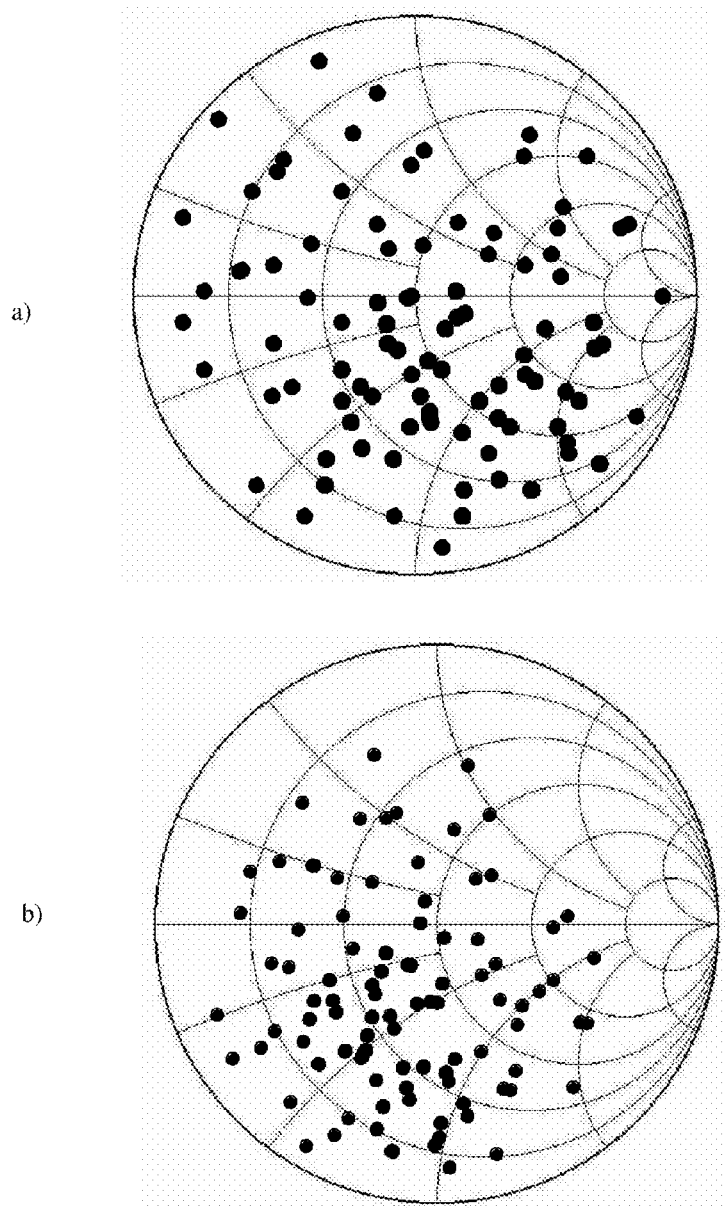
FIGURE 14: random source reflection factor distribution; a) low frequency, b) high frequency

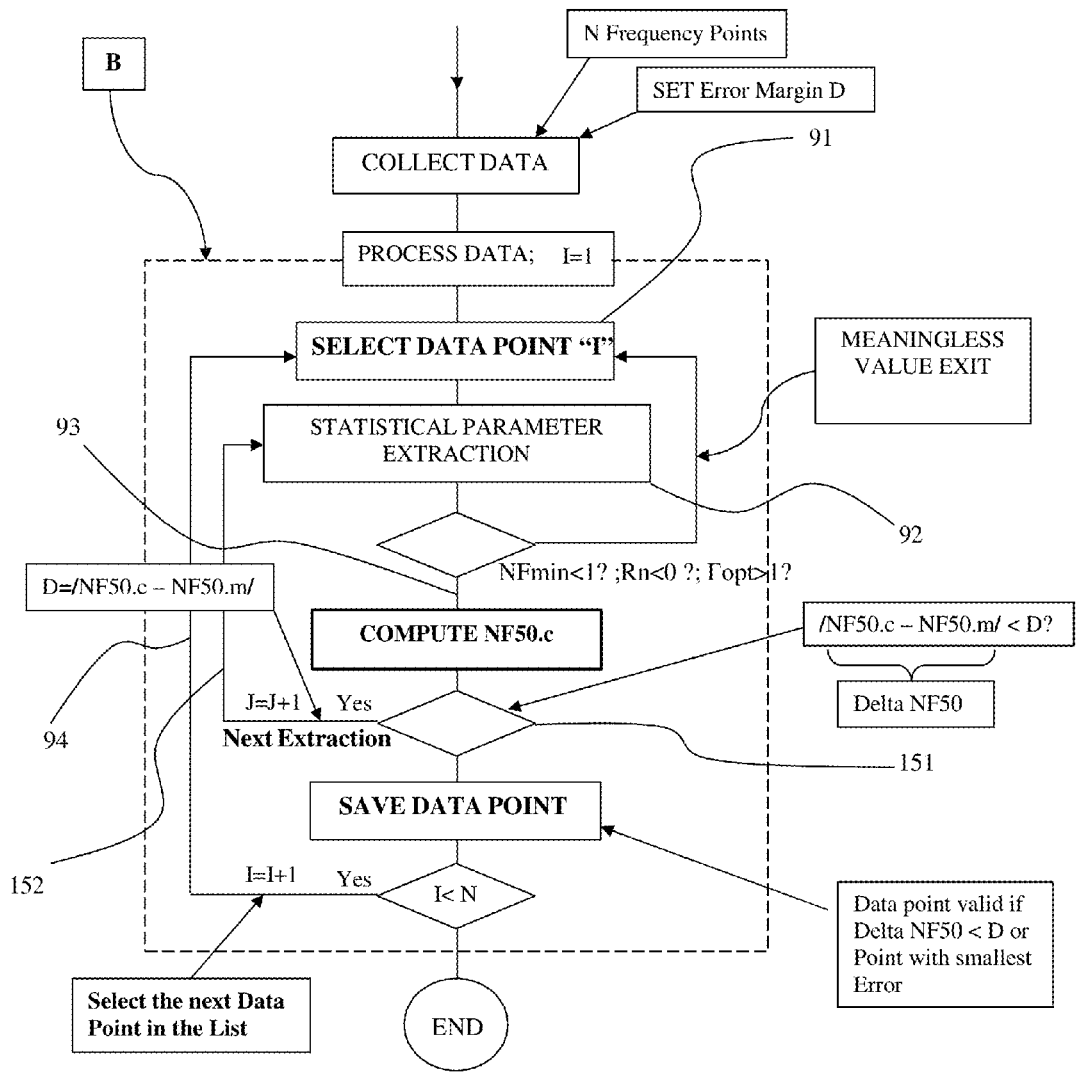
FIGURE 15: Noise parameter extraction using NF50 criterion

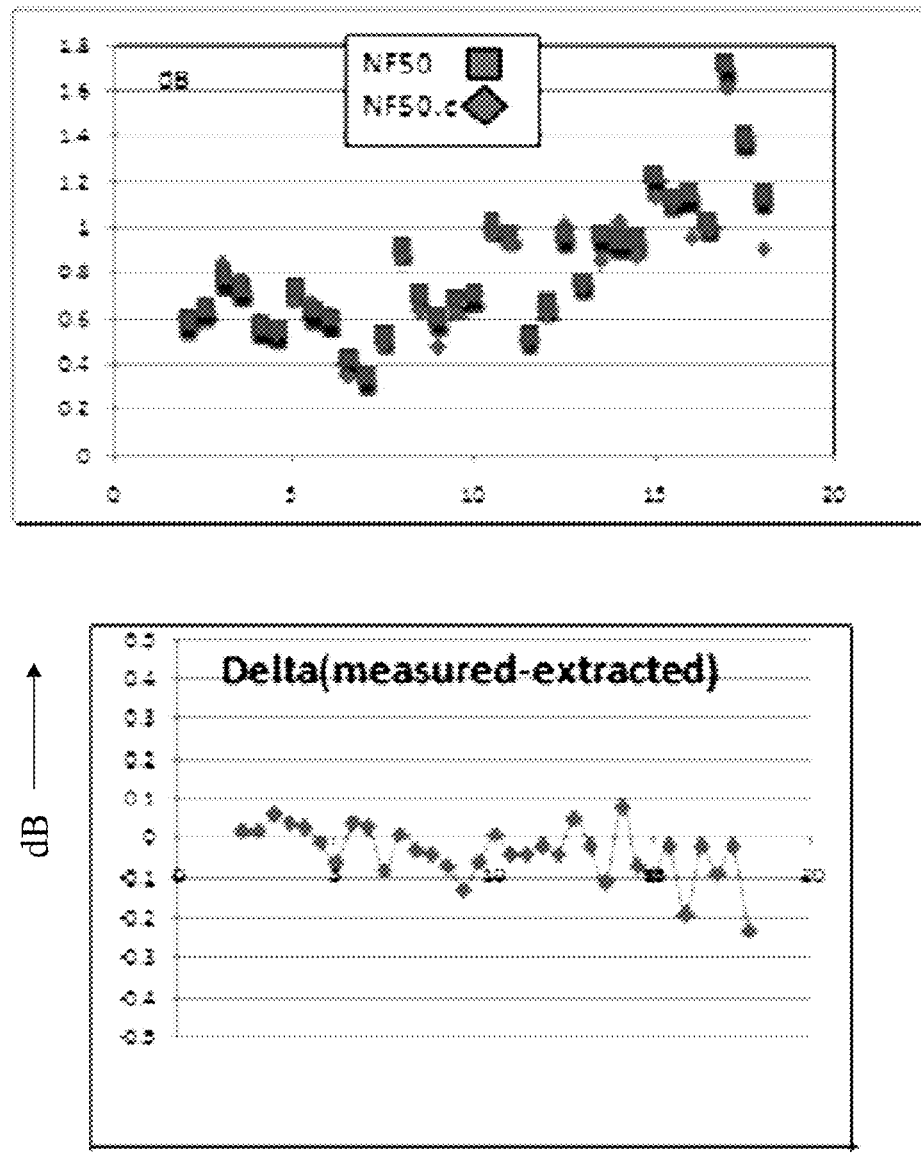
FIGURE 16: Noise figure at 50Ω: NF50, measured, and NF50.c, extracted, used as wideband extraction criterion.

NOISE PARAMETER MEASUREMENT SYSTEM AND METHOD

PRIORITY CLAIM

Not Applicable

CROSS-REFERENCE TO RELATED ARTICLES

[1] H. ROTHE and W. DAHLKE, "Theory of noisy four poles", Proceedings of the IRE, June 1956, pages 811-818.
[2] "Friis formulas for noise", http://en.wikipedia.org/wiki/Friis_formulas_for_noise
[3] SISCHKA, Franz, "Basics of S-parameters, part 1", Characterization handbook, March 2002.
[4] "Understanding Noise Parameter Basics/Understanding Noise Parameter Measurements", Application Note AN60-040, http://www.modelithics.com/literature.asp.
[5] SIMPSON, G. "Data measurement methods and systems", U.S. Provisional patent application US 2010/0030504 A1.
[6] M. SANNINO, "On the determination of Device Noise and Gain Parameters", Proceedings IEEE, vol. 67, pages 1364-1382, September 1979.
[7] R. LANE, "The determination of Device Noise Parameters", Proceedings IEEE, vol. 57, pages 1461-1462, August 1969.
[8] Patent DE 41 22 189 (1268-P).
[9] "Noise Figure Measurement Accuracy—The Y-Factor Method", Agilent Application Note 57-2, http://cp.literature.agilent.com/litweb/pdf/5952-3706E.pdf.
[10] "About Adapter Removal Calibration Technique", Agilent, http://ena.tm.agilent.com/e5071c/manuals/webhelp/eng/measurement/calibration/advanced_calibrations/adapter_removal.htm#About_Adapter_Removal.
[11] "Stability Circles: Input/Output Plane Stability Circles (SB1, SB2)", Agilent, http://cp.literature.agilent.com/litweb/pdf/genesys200801.
[12] "Singular Value Decomposition", Wikipedia, http://en.wikipedia.org/wiki/Singular_value_decomposition.

STATEMENT REGARDING FEDERALLY SPONSORED RESEARCH OR DEVELOPMENT

Not Applicable

REFERENCE TO SEQUENCE LISTING, A TABLE, OR A COMPUTER PROGRAM LISTING COMPACT DISC APPENDIX

Not Applicable

BACKGROUND OF THE INVENTION AND PRIOR ART

This invention relates to testing and characterization of microwave of low noise microwave and RF transistors and amplifiers (device under test, DUT); the method disclosed comprises a test setup and a data acquisition and processing method for extracting the "four noise parameters" of said DUT. The test setup uses automatic microwave tuners in order to synthesize reflection factors (or impedances) at the input of said DUT and allow collecting the necessary data using appropriate high sensitivity receivers.

All RF two-ports containing semiconductor devices (DUT) contain internal noise sources which affect the purity of the signal entering at the input port and existing (amplified) at the output port. A common way of characterizing the "purity" of said DUT at each frequency and bias conditions is the "noise figure: NF". The noise figure is defined as the degradation of the signal to noise ratio between the input and output port of the DUT: $NF=(S.in/N.in)/(S.out/N.out)$ (eq. 1). Since the DUT adds to the transmitted signal its internal noise, the S/N ratio at the input is higher than at the output, therefore $NF>1$.

It has been established [1] that four real numbers fully describe the noise behavior of any noisy two-port; these are the four noise parameters. By generally accepted convention said four noise parameters (4NP) are: Minimum Noise Figure (NFmin), Equivalent Noise Resistance (Rn) and Optimum Noise Admittance ($Yopt=Gopt+j*Bopt$) [4]. The noise behavior of a two-port only depends on the admittance of the source and not of the load. The general relationship is: $NF(Ys)=NFmin+Rn/Re\{Ys\}*|Ys-Yopt|^2$ (eq. 2).

NF(Ys) in eq. (2) being the noise figure of the chain including the DUT and the receiver, the relationship introduced by FRIIS [2] is used to extract the noise figure of the DUT itself: FRIIS' formula is: $NF.dut=NF.total-(NF.rec-1)/Gav.dut$ (eq. 3); hereby NF.dut is the noise figure of the DUT, NF.rec is the noise figure of the receiver and Gav.dut is the available Gain of the DUT for the given frequency and bias conditions. Both NF.rec and Gav.dut depend both, on the S-parameters of the DUT and the source admittance Ys (eq. 2) and [3].

The basic, prior art, test setup is shown in FIG. 1: It comprises a calibrated noise source (1), an impedance tuner (2), a test fixture (3) to hold the DUT and a sensitive noise receiver (4). The tuner (2) and the noise receiver (4) are controlled by a system computer (5), which sets the source admittance Ys (6), created by the tuner, and retrieves digitally the associated noise measurement data from the noise receiver (4). After termination of the measurement session the computer program processes the measured data and extracts the four noise parameters of the DUT for a given frequency and DUT bias conditions. At least 4 values for Ys are required to extract the 4 noise parameters, but in general there have been used between 7 and 11 Ys values, in order to cancel out and compensate for random measurement errors.

From eq. 2 it follows that, in order to determine the four noise parameters, one would have to take four measurements at four different source admittance values Ys. However, noise measurements are extremely sensitive and various disturbances cause measurement errors and uncertainties. It is therefore the accepted procedure to acquire more than four data points, at each frequency and extract the noise parameters using a linearization and error minimization technique [2: Lane]. This method has been used and refined for many years ([5], FIGS. 2, 3 and [6]) but is in general cumbersome and prone to insufficiencies, since the DUT may oscillate or the impedance tuner may create measurement errors, which are difficult to identify and eliminate if there are not enough data points to extract from. The conclusion is that, to improve the reliability of the measurement one needs more data and elaborated extraction algorithms in order to deal with the noise parameter extraction problem as a statistical observation event.

Simpson [5], FIG. 4, discloses a measurement algorithm, which superimposes a tuning loop over a parameter loop; parameter being either frequency or DC bias of the DUT. This is done in order to increase the measurement speed, at the risk of measurement accuracy. In this case the measurement speed is higher, because changing frequency or DC bias is an electronic operation and much faster than changing (mechanical) tuner states. However it is impossible to optimize the tuning pattern for each parameter setting, as Simpson attempts: for each frequency the same tuner probe/slug position corresponds to different source admittance and for each other DC bias point the optimum area of source admittance is different, since the parameters of the DUT change with DC bias. Simpson, however, does not disclose any data cleaning and filtering criteria, beyond an algorithm for optimizing the distribution of tuner settings, which in end-effect is ineffective.

In this invention a fast noise parameter measurement algorithm including a broad family of data structuring and filtering criteria is disclosed, which allows generally valid and effective data point selection and post-measurement processing.

DESCRIPTION OF THE DRAWINGS

FIG. 1 depicts prior art, the principle of noise parameter measurement system.

FIG. 2 depicts prior art, a traditional noise parameter measurement setup.

FIG. 3 depicts prior art, a noise parameter measurement procedure using a tuning loop inside the parameter loop.

FIG. 4 depicts prior art, a noise parameter measurement procedure using a parameter loop inside the tuning loop.

FIG. 5 depicts a noise parameter measurement system using a stand-alone noise receiver.

FIG. 6 depicts a noise parameter measurement system using a network analyzer as noise receiver.

FIG. 7 depicts a noise parameter measurement system using a network analyzer as noise receiver and a small signal instead of a noise source.

FIG. 8 depicts a noise parameter measurement algorithm using parameter and data filtering.

FIG. 9 depicts the operation detail "A" of the measurement algorithm depicted in FIG. 8.

FIG. 10 depicts the complete measurement procedure for a frequency sweep.

FIG. 11 depicts the complete measurement procedure for a DC bias sweep.

FIG. 12 depicts the effect of data filtering on the extracted minimum noise figure NFmin.

FIG. 13 depicts prior art [5], the distribution of the source reflection factor.

FIG. 14 depicts the random source reflection factor distribution at respectively low frequency and high frequency.

FIG. 15 depicts the principle of noise parameter extraction using the NF50 criterion.

FIG. 16 depicts the noise figure at 50Ω: NF50, measured, and NF50.c, extracted, used as wideband extraction criterion.

DETAILED DESCRIPTION OF THE INVENTION

The method described here can be employed with three different test setups depending on the available test equipment (FIGS. 5, 6 and 7). In FIG. 5 a network analyzer (51) is included, as a separate unit from the noise receiver (513) and can be switched on to the DUT (514), path (52) using switches (53) and (510) in order to measure the S-parameters of the DUT. In this case the tuner (56) is initialized (=full transmission line) and the two bias tees (55) and (515) are part of a previous calibration, which allows de-embedding the S-parameters and correcting to the DUT reference plane [10]. The receiver (513) is preceded by a low noise amplifier (511) which increases the sensitivity of the measurement and a directional coupler (512) which allows connecting to a spectrum analyzer (59) for detecting spurious oscillations but also spurious interfering signals from outside. The power supply (58) is also monitored by the control computer, in order to detect bias instabilities during the measurement. For noise measurement the switches (53) and (510) then switch back to path (516) which includes the noise source (54).

An alternative test setup is shown in FIG. 6: here a network analyzer (63) serves both, as a noise receiver and S-parameter measurement instrument. Again the signal path must be switched between S-parameter measurement (path 614) and noise measurement (path 615) using the switches (62) and (613). All other components and operations, including noise source (61), bias tees (64) and (67), source tuner (65), low noise amplifier (68) and directional coupler (69) are the same as in the setup of FIG. 5.

FIG. 7 shows a measurement configuration which measures noise figure without using a noise source [8]; in this case the noise figure is not measured as the ratio of noise powers at the receiver end as before [9]. This alternative method uses the Signal/Noise Ratio definition of noise figure, i.e. NF={(Signal/Noise)IN}/{(Signal/Noise)OUT} (eq. 4); which is the division of signal to noise power ratio at the input of the DUT by the signal to noise power ratio at the output of the DUT or otherwise said: The "Signal Purity Degradation" due to a noisy two-port. For linear single frequency two-ports both said noise figure definitions are equivalent. In the setup of FIG. 7 the noise source is therefore eliminated. Instead a small signal generated at the first port (121) of the network analyzer (133) is injected into the DUT (124) and it is measured at the second port of the network analyzer (132). At this time the received signal is split in two equal parts, inside the network analyzer (133) and one part is detected as RMS (Root Mean Square) and the other part as average (AVG). Since noise is a random phenomenon, signal integration of a certain period of time will produce the net signal, clear of noise, because random noise cancels out. Instead RMS is the average of the signal square over time, in which case any negative noise contribution will be squared and added to the result. In short RMS includes noise and AVG does not. By subtracting the two and calculating the ratio we obtain the Signal/Noise ratio at any reference plane, at the input of the DUT (during system calibration) or at the output. This method of measuring noise figure is compatible with the presented noise parameter measurement method as well with the tuner (123) setting the source admittance values, the DC bias supplied by the power supply (128) and monitored through the bias tees (122) and (125) and the signal amplified by the low noise receiver (126). The switch (130) switches the measuring path between S-parameters (132) and noise (131), since the DUT S-parameters cannot be measured through the low noise amplifier (126). The coupler (127) and the spectrum analyzer (129) serve for detecting spurious signals.

The test setups shown in FIGS. 5, 6 and 7 all allow full deployment of the new measurement procedure: a wide spread of tuner settings is used with many more impedances than the hitherto 7 or 11 values reported in the literature [6, 7]; a typical number is 50 tuner settings; this allows selecting for each frequency and each bias point enough valid data allowing a reliable extraction of the four noise parameters at each individual frequency and bias condition, even though both, the tuner source admittances and the DUT S-parameters vary considerably over the whole frequency range and the DC bias range. This method is mainly advantageous for "parameter swept" measurements (full frequency range or full DC bias range); but the method is also sensitive, because it allows collecting useless data points, which, if not cleaned using appropriate numerical and physical filtering criteria, will falsify the extracted noise parameter results.

The flow graph of the general measurement procedure, applicable for all three test setups of FIGS. 5, 6 and 7, is shown in FIG. 8: In a first step (71) the tuner state (Ys or Γs) is set; all tuner states used here are part of a general pattern which is designed to cover a large area of the Smith chart for the lowest frequency of operation. When this is the case, then, due to the tuner's nature, the Smith chart at higher frequencies is covered as well, in several cases twice or more times within the horizontal movement of the tuner probe, but this is not contradictory to the statistical method used. Inside the tuning loop all other operations are nested and, depending on the various criteria, there are exits returning to the next tuning state (73, 76 and 78). As a first action after the tuner is set the physical stability of the DUT is verified (72). This is done using the monitoring of the DC bias (58, 611) and the spectrum analyzer (59, 612). If any spurious signals appear on the spectrum analyzer (59) or DC bias change is detected (73), this means all data at all frequencies are invalid and the measurement ignores any further step, does not execute any measurement and returns to the tuning loop to proceed with the next tuner setting. This "physical stability" test saves a lot of time and eliminates many sources of error.

In the next step the swept parameter is set (74) to its first and subsequent values. The swept parameter can be a) the frequency or b) the DC bias. If it is a) the frequency then the operation does not need additional data to proceed, except S-parameters for each frequency which are saved for all frequencies in a once measured S-parameter file for the specific DC bias point or b) if the swept parameter is the DC bias, then for each change in this parameter, new S-parameter data must be retrieved from memory (this data must are either collected before or the system switches from noise (615) to S-parameter (614) each time said swept DC bias changes). In general each S-parameter data file includes one DC bias point and all frequencies. It is possible to extend this feature to create multi-dimensional S-parameter files including several DC bias point blocks and all frequencies for each block. In this case the same multi-dimensional S-parameter file can be used.

After the swept parameter is set in step (74) a numerical test in two steps takes place: in a first step (75) the "numerical instability" is verified; in this the mismatch factor M is calculated from Ys and the S-parameters of the DUT at this DC bias and frequency; M is defined as: $M=1/(1-|\Gamma.dut|^2)$ (eq. 6); here Γ.dut is the reflection factor seen by the receiver (chain of 515, 510, 511, 512 and 513) at the output of the DUT (514); this can be calculated as: $\Gamma.dut=S22+(S12*S21*\Gamma s)/(1-S11*\Gamma s)$ (eq. 7); where $\Gamma s=(Yo-Ys)/(Yo+Ys)$ (eq. 8), where Yo=characteristic admittance, Yo=20 mS. The mismatch factor M indicates how close the source impedance is to the stability circle [11] of the DUT at the specific frequency and DC bias. When the source admittance is such that the magnitude of the output reflection factor of the DUT is equal to 1 (|Γ.dut|=1 or M=infinite or the real part of the DUT's output impedance is negative: Re{Z.out}<0.) in which case measurement is impossible, because power cannot be transferred from the DUT to the noise receiver. In fact the measurement inaccuracy starts increasing when M exceeds a certain value; a successfully used experimental value for M has been approximately 4. In the measurement algorithm the limit in M can be set by the user, and this depends on the DUT stability behavior.

In a second step (77) the reflection factor Γs generated by the tuner is calculated using the tuner calibration data. If this value exceeds a user defined maximum, typically 0.9 to 0.95, then, again the measurement loop exits and returns to the next tuning step (715); the reason for this test is that, by experience, when tuners generate high reflection, their accuracy degrades and by consequence the accuracy of the measurement degrades as well. The reason for this is related both to mechanical imprecision of the tuners, as well inaccuracy of network analyzers in measuring very high reflection factors, close to 1. This test is called "predictable inaccuracy test".

When all three tests pass successfully, then the algorithm proceeds with collecting actual noise figure data and saving them for later processing. Subsequently the algorithm continues with the next parameter value (711) and once all parameter vales have been applied it proceeds with the next tuning point (712), until all tuner settings are used and the measured data saved. When the whole cycle is finished the algorithm proceeds with data processing (713), an operation described here as flow-chart "A", and is outlined in FIG. 9.

The data processing block "A" is shown in detail in a flow-chart in FIG. 9: For each frequency or DC bias point (DATA POINT), (91) a noise parameter extraction is attempted (92), using least square fitting of data (Singular Value Decomposition) [12] and several thousands of permutations of partial sets of source admittance values. The choice of source admittances used in each of the permutations depends on which noise parameter to extract: for instance, for the minimum noise figure NFmin admittances with the lowest measured noise figure are chosen. For the optimum noise admittance Yopt as well. But for the equivalent noise resistance Rn also points far from the minimum position are required, since Rn describes the slope of increase of the noise figure NF(Ys) when the source admittance moves away from the optimum value Yopt (see eq. 2). Each time a set of results is obtained (which is not always the case, because of the random measurement errors associated with the noise measurement) it has to pass the "Meaningless Value test". This means that certain conditions must be met, such as, the minimum noise figure NFmin cannot be <1, or the noise resistance Rn cannot be <0 or the optimum reflection factor Γopt cannot be >1 (see eq. 8). If this test passes (93) then the result is saved as a valid point (95) and the next parameter point is processed (94).

FIGS. 10 and 11 show the detailed flow-chart of the measurement procedure in the case of the swept parameter being the frequency (case 1) or the DC bias (case 2). In case 1 (frequency is the swept parameter, FIG. 10) S-parameters are measured only for all frequencies and only the specific bias point and saved on file (101). In case 2 (DC bias is the swept parameter, FIG. 11) S-parameters are measured for all frequencies and all DC bias points and saved either on separate or on a multi-parameter data file (111). In case 1 the physical stability is tested after each tuner movement (102). If any change in DC bias or any spurious signals are detected, the whole cycle is short cut and the algorithm goes to the next tuner point. If this test is successful the algorithm (case 1) enters the frequency loop and executes noise figure measurements checking only numerically the mismatch factor M (103) and reflection factor Γs. If either condition is not fulfilled the algorithm exits to the next frequency point (105). The procedure then continues with data acquisition and saving until the frequency loop and subsequently the tuner admittance loop have completed. Following that the procedure enters the Data Processing and Extraction block "A", which is shown in FIG. 9.

The procedure in case 2 (DC bias being the swept parameter) is shown in FIG. 11; in this case the frequency is set and the DC bias is swept over a pre-defined range, for which S-parameters have been pre-measured and saved. In this case the physical stability is checked as a first step (112) and if the test passes then the mismatch factor M and Γs are again checked. M changes, even though the frequency is constant, because the S-parameters of the DUT change with DC bias (see eqs. 6 and 7). If the mismatch factor test M>$M_{max}$ fails (113) then the next bias point is tested. If the reflection factor test Γ>Γmax fails (114) then the next tuner point is set. Once both tests passed, again noise figure data are acquired (115) and the DC bias cycle continues after the termination of which the tuner loop continues with the next tuner point, until both cycles terminate and all data are saved. Then the procedure enters the data processing and parameter extraction block "A" shown in FIG. 9.

As an example of the effect of data filtering and statistical noise parameter extraction some actually measured results are shown in FIG. 12: It can be seen that the "raw" (unfiltered data) are too dispersed to make any physical sense (130). To be noticed that these results have been extracted after all "physical instability" tests have passed. After passing the additional "numerical stability test", including mismatch factor M and $Γ_{max}$ test (which in fact is a measurement accuracy confirmation test) the result is more consistent (131). Finally when the extracted result is checked for physically meaningful values the parameter behavior is very close to optimum (132). It is noticeable that the physical stability test already done before the result in FIG. 12 is displayed, has already produced acceptable data, but too dispersed to be useful for a frequency by frequency analysis. However the trace drawn through the data sets in all three cases (130 to 132) are very similar. Nevertheless said traces are pure numerical data manipulations and shall not replace the real additional tests in the data acquisition and processing procedure.

In this invention we present alternative methods of measuring the four noise parameters of noisy RF two-ports. The methods comprise three different test setups and two different data acquisition methods known from prior art. The selection of source admittances over a wide frequency range and the selection of valid points as well as the statistical extraction algorithms are new for this kind of application. The procedure's steps may be varied slightly and certain steps may be omitted in particular cases, but this shall not impede on the originality of the method, which treats sensitive noise measurements as what they are, a statistical phenomenon that shall not be treated deterministically. The extracted data, compared with all previous results, confirm this assumption.

What I claim as my invention is:

1. A two-port noise parameter measurement and extraction method for computerized noise measurement system,
    said system comprising a noise measurement path comprising a cascade of calibrated noise source, input DC bias network (Bias-T), automatic impedance tuner, DUT in a test fixture, output DC bias network (Bias-T), noise receiver,
    said noise measurement path being delimited between said noise source and noise receiver,
    and a small signal measurement path delimited between the ports of a network analyzer,
    and DC bias supply and DC bias and RF monitoring equipment,
    and RF switches allowing to direct the signal flow from noise to small signal measurement path;
    whereby the noise figure of the DUT is measured by the noise receiver using said calibrated noise source as a function of the source impedance;
    said source impedance being generated by said impedance tuner;
    said noise figure being measured at a multitude of frequencies and source impedances;
    and dedicated control, evaluation and noise parameter extraction software using a large number of random tuner settings and allowing extraction of two-port noise parameters through noise figure data filtering based on DUT stability and extraction convergence criteria,
    said extraction method comprising the following steps:
    a) biasing the DUT;
    b) collecting small signal s-parameter for all selected frequencies;
    c) synthesizing a number of pre-determined source-tuner-settings/tuning using the impedance tuner;
    d) verifying the physical stability of the DUT and jumping to step c) if DUT unstable;
    e) sweeping the measurement frequency of the noise receiver for each synthesized source tuner setting;
    f) collecting noise power data for the selected frequency;
    g) verifying the numerical stability of the DUT, by calculating the mismatch factor M and source reflection factor magnitude and jumping to next frequency point in e);
    h) verifying the validity of the measured noise figure data and eliminating unphysical data;
    i) continuing to e) for the next frequency until the end of the frequency loop;
    j) continuing to c) for the next source tuner setting until the end of the tuning loop;
    k) extracting the four two-port noise parameters for each frequency and a large number of source impedance permutations;
    l) selecting the extraction results to form a physically meaningful set of data over the whole frequency range.

2. A two-port noise parameter measurement and extraction method as in claim 1, whereby said source impedances are randomly distributed over the Smith chart.

3. A two-port noise parameter measurement and extraction method as in claim 1, whereby the number of source impedances selected among all measured impedances in order to create permutations, in step 15k), varies, typically, but is not limited to, between 7 and 11.

4. A two-port noise parameter measurement and extraction method for a test system as in claim 1, whereby said measured data are validated in step 15d) as follows:
    for each source tuner setting at which,
    a) the DC bias current displays instability, all frequency data points are discarded from the measurement data base; said instability being detected by sudden change in DC bias current;
    b) the spectrum analyzer detects spurious oscillations, at any frequency, data points at all frequencies are discarded from the measurement data base.

5. A two-port noise parameter measurement and extraction method for a test system as in claim 1, in which said measured data are validated in step 15g) as follows:
    a) discard source reflection factors (impedances) from measurement data when Γs($F_i$) exceeds a certain, user defined value; said value being, typically Γs($F_i$)=0.9 to 0.95, whereby Fi is any measurement frequency inside the measurement frequency range;
    b) discard source reflection factors (impedances) from measurement data when the output mismatch factor M(Γs) of the DUT exceeds a user defined value, typically M=4; said mismatch factor being defined as M=1/(1−|Γ.dut|$^2$), whereby Γ.dut is the output reflection factor of the DUT for a given source reflection factor Γs.

6. A two-port noise parameter measurement system as in claim 1 comprising a validation of the extracted four noise parameters by using the NF50 method;
    said NF50 method comprising as a validation criterion the minimization of the difference between the measured noise figure at a source impedance Zso and the noise figure NF50.c which is calculated at the same source impedance Zso using the extracted four noise parameters, whereby Zso is equal to or near 50Ω.

7. A two-port noise parameter measurement system as in claim 1 comprising multiple noise parameter extractions for all possible cross combinations/permutations of source impedance states at each measured frequency allowing reliable and physically meaningful generation of wideband noise parameters, even for very low noise and potentially unstable DUT's.

8. A two-port noise parameter measurement and extraction method for a test system as in claim 1 in which step 15a) is replaced by: setting the test frequency; and step 15e) is replaced by: sweeping the selected DC bias range; and step 15h) is replaced by: continuing to e) for the next DC bias point until the end of the DC bias loop.

9. A two-port noise parameter measurement and extraction method for computerized noise measurement system comprising a network analyzer as signal source and receiver and a signal and noise measurement path, said measurement path being delimited between the signal source and the receiver port of said network analyzer, and a cascade of input bias network (Bias-T), automatic impedance tuner, DUT in a test fixture, output bias network (Bias-T) and DC supply, and DC bias and RF monitoring equipment, and whereby a small signal is injected into the input port of the DUT by the signal source of said network analyzer at the test frequency, and the output signal of said DUT is injected into the receiver port of said network analyzer, and whereby the noise figure of the DUT is calculated from the ratio between RMS (root mean square) signal power and average signal power, measured by the receiver, as a function of the source impedance;

said source impedance being generated by said impedance tuner;

said noise figure being measured at a multitude of frequencies and source impedances;

and dedicated control, evaluation and parameter extraction software using a large number of random tuner settings and allowing extraction of two-port noise parameters through noise figure data filtering based on DUT stability and extraction convergence criteria, said extraction method comprising the following steps:

a) biasing the DUT;

b) collecting small signal s-parameter for all selected frequencies;

c) synthesizing a number of pre-determined source-tuner-settings/tuning using the impedance tuner;

d) verifying the physical stability of the DUT and jumping to step c) if DUT unstable;

e) sweeping the measurement frequency of the noise receiver for each synthesized source tuner setting;

f) collecting noise power data for the selected frequency;

g) verifying the numerical stability of the DUT, by calculating the mismatch factor M and source reflection factor magnitude and jumping to next frequency point in e);

h) verifying the validity of the measured noise figure data and eliminating unphysical data;

i) continuing to e) for the next frequency until the end of the frequency loop;

j) continuing to c) for the next source tuner setting until the end of the tuning loop;

k) extracting the four two-port noise parameters for each frequency and a large number of source impedance permutations;

l) selecting the extraction results to form a physically meaningful set of data over the whole frequency range.

10. A two-port noise parameter measurement and extraction method as in claim 9, whereby said source impedances are randomly distributed over the Smith chart.

11. A two-port noise parameter measurement and extraction method as in claim 9, whereby the number of source impedances selected among all measured impedances in order to create permutations, in step 23k), varies, typically, but is not limited to, between 7 and 11.

12. A two-port noise parameter measurement and extraction method for a test system as in 9, whereby said measured data are validated in step 23d) as follows:

for each source tuner setting at which
a) the DC bias current displays instability all frequency data points are discarded from the measurement data base; said instability being detected by sudden change in DC bias current, or
b) the spectrum analyzer detects spurious oscillations, at any frequency, data points at all frequencies are discarded from the measurement data base.

13. A two-port noise parameter measurement and extraction method for a test system as in claim 9, in which said measured data are validated in step 23g) as follows:

a) discard source reflection factors (impedances) from measurement data when $\Gamma s(F_i)$ exceeds a certain, user defined value; said value being, typically $\Gamma s(F_i)=0.9$ to 0.95, whereby Fi is any measurement frequency inside the measurement frequency range;

b) discard source reflection factors (impedances) from measurement data when the output mismatch factor $M(\Gamma s)$ of the DUT exceeds a user defined value, typically M=4; said mismatch factor being defined as $M=1/(1-|\Gamma.dut|^2)$, whereby $\Gamma.dut$ is the output reflection factor of the DUT for a given source reflection factor $\Gamma s$.

14. A two-port noise parameter measurement system as in claim 9 comprising a validation of the extracted four noise parameters by using the NF50 method;

said NF50 method comprising as a validation criterion the minimization of the difference between the measured noise figure at a source impedance Zso and the noise figure NF50.c which is calculated at the same source impedance Zso using the extracted four noise parameters, whereby Zso is equal to or near 50Ω.

15. A two-port noise parameter measurement system as in claim 9 comprising multiple noise parameter extractions for all possible cross combinations/permutations of source impedance states at each measured frequency allowing reliable and physically meaningful generation of wideband noise parameters, even for very low noise and potentially unstable DUT's.

16. A two-port noise parameter measurement and extraction method for a test system as in claim 9 in which step 23a) is replaced by: setting the test frequency; and step 23e) is replaced by: sweeping the selected DC bias range; and step 23h) is replaced by: continuing to e) for the next DC bias point until the end of the DC bias loop.

\* \* \* \* \*